(12) United States Patent
Sakuma et al.

(10) Patent No.: US 8,981,627 B2
(45) Date of Patent: Mar. 17, 2015

(54) PIEZOELECTRIC DEVICE WITH ELECTRODE FILMS AND ELECTROCONDUCTIVE OXIDE FILM

(75) Inventors: Hitoshi Sakuma, Tokyo (JP); Katsuyuki Kurachi, Tokyo (JP); Yasuhiro Aida, Tokyo (JP); Kazuhiko Maejima, Tokyo (JP); Mayumi Nakajima, Tokyo (JP)

(73) Assignee: TDK Corporation, Tokyo (JP)

(*) Notice: Subject to any disclaimer, the term of this patent is extended or adjusted under 35 U.S.C. 154(b) by 401 days.

(21) Appl. No.: 13/487,563

(22) Filed: Jun. 4, 2012

(65) Prior Publication Data

US 2013/0320814 A1 Dec. 5, 2013

(51) Int. Cl.
*H01L 41/08* (2006.01)
*H01L 41/047* (2006.01)

(52) U.S. Cl.
CPC ........ *H01L 41/0815* (2013.01); *H01L 41/0477* (2013.01)
USPC .......................................... 310/363; 310/328

(58) Field of Classification Search
CPC .......................... H01L 41/047; H01L 41/0471
USPC .................................................. 310/363–365
See application file for complete search history.

(56) References Cited

U.S. PATENT DOCUMENTS

| | | | |
|---|---|---|---|
| 5,458,986 A | | 10/1995 | Wilber et al. |
| 6,476,540 B2 * | | 11/2002 | Takeuchi et al. ............... 310/331 |
| 6,965,190 B2 * | | 11/2005 | Tanuma et al. ............... 310/363 |
| 7,187,253 B2 * | | 3/2007 | Sano et al. ..................... 333/187 |
| 7,213,322 B2 * | | 5/2007 | Nakagawara et al. .......... 29/594 |
| 7,268,647 B2 * | | 9/2007 | Sano et al. ..................... 333/187 |
| 7,323,805 B2 * | | 1/2008 | Sano et al. ..................... 310/358 |
| 7,535,157 B2 * | | 5/2009 | Saito .............................. 310/363 |
| 7,901,800 B2 | | 3/2011 | Shibata et al. |
| 2005/0098816 A1 | | 5/2005 | Baniecki et al. |
| 2005/0184627 A1 | | 8/2005 | Sano et al. |
| 2006/0214542 A1 | | 9/2006 | Iwashita et al. |
| 2007/0188270 A1 * | | 8/2007 | Ohara et al. ................... 333/189 |
| 2007/0284971 A1 * | | 12/2007 | Sano et al. ..................... 310/364 |
| 2008/0074005 A1 | | 3/2008 | Sano et al. |
| 2008/0248324 A1 | | 10/2008 | Murayama et al. |
| 2009/0033177 A1 | | 2/2009 | Itaya et al. |
| 2009/0075066 A1 | | 3/2009 | Shibata et al. |
| 2010/0097723 A1 | | 4/2010 | Hata et al. |

(Continued)

FOREIGN PATENT DOCUMENTS

EP 2-086-031 A2 8/2009
JP A-11-097755 4/1999

(Continued)

OTHER PUBLICATIONS

Yamadera, Hideya, "Measurement and Control of Thermal Stress in Thin Films," R&D Review of Toyota CRDL, vol. 34, No. 1, 1999, pp. 19-24 (with abstract).

(Continued)

*Primary Examiner* — J. San Martin
(74) *Attorney, Agent, or Firm* — Oliff PLC

(57) ABSTRACT

A piezoelectric device has a first electrode film, a piezoelectric film provided on the first electrode film, and a second electrode film provided on the piezoelectric film. At least one of the pair of electrode films is composed of an alloy, and a major component of the alloy is a metal selected from the group consisting of Ti, Al, Mg, and Zn.

18 Claims, 4 Drawing Sheets

(56) References Cited

U.S. PATENT DOCUMENTS

| | | |
|---|---|---|
| 2010/0117493 A1 | 5/2010 | Hayashi et al. |
| 2011/0109701 A1* | 5/2011 | Ohashi .......................... 347/68 |
| 2011/0121690 A1 | 5/2011 | Shibata et al. |
| 2012/0032300 A1 | 2/2012 | Wang |
| 2014/0145557 A1* | 5/2014 | Tanaka ..................... 310/313 D |

FOREIGN PATENT DOCUMENTS

| | | |
|---|---|---|
| JP | A-2003-176176 | 6/2003 |
| JP | A-2006-100622 | 4/2006 |
| JP | A-2006-188414 | 7/2006 |
| JP | A-2006-286911 | 10/2006 |
| JP | A-2007-277606 | 10/2007 |
| JP | B2-4142128 | 8/2008 |
| JP | A-2008-211385 | 9/2008 |
| JP | A-2009-094449 | 4/2009 |
| JP | A-2010-103194 | 5/2010 |

OTHER PUBLICATIONS

May 14, 2013 Written Opinion of the International Searching Authority issued in International Application No. PCT/JP2013/063877.

May 14, 2013 International Search Report issued in International Application No. PCT/JP2013/063877.

Office Action dated Feb. 21, 2014 issued in U.S. Appl. No. 13/487,530.

U.S. Appl. No. 13/487,530, filed Jun. 4, 2012.

Office Action dated Jul. 28, 2014 issued in U.S. Appl. No. 13/487,530.

* cited by examiner (a)

(c)

(b)

(d)

| | | | | | |
|---|---|---|---|---|---|
| Li⁺ | -3.040 | Nb³⁺ | -1.099 | Ru²⁺ | +0.455 |
| K⁺ | -2.925 | Ta⁵⁺ | -0.810 | Cu⁺ | +0.520 |
| Rb⁺ | -2.924 | Zn²⁺ | -0.763 | Rh⁺ | +0.600 |
| Ba²⁺ | -2.920 | Cr³⁺ | -0.740 | Hg⁺ | +0.796 |
| Sr²⁺ | -2.890 | Fe²⁺ | -0.440 | Ag⁺ | +0.799 |
| Ca²⁺ | -2.840 | Cd²⁺ | -0.403 | Hg²⁺ | +0.850 |
| Na⁺ | -2.714 | Co²⁺ | -0.277 | Pd²⁺ | +0.915 |
| Mg²⁺ | -2.356 | Ni²⁺ | -0.257 | Ir³⁺ | +1.156 |
| Al³⁺ | -1.676 | Sn²⁺ | -0.138 | Pt²⁺ | +1.188 |
| Ti²⁺ | -1.630 | Pb²⁺ | -0.126 | Au³⁺ | +1.520 |
| Zr⁴⁺ | -1.550 | H+ | 0.000 | Au⁺ | +1.830 |
| Mn²⁺ | -1.180 | Cu²⁺ | +0.337 | | |

UNIT:V

LOW ⟵ OXIDATION-REDUCTION POTENTIAL ⟶ HIGH

HIGH ⟵ IONIZATION TENDENCY ⟶ LOW (a)

(b)

(c)

(d)

(e)

(f)

(g)

PRIOR ART

PIEZOELECTRIC DEVICE WITH ELECTRODE FILMS AND ELECTROCONDUCTIVE OXIDE FILM

BACKGROUND OF THE INVENTION

1. Field of the Invention

The present invention relates to a piezoelectric device.

2. Related Background Art

There are conventionally known piezoelectric devices having a piezoelectric film and a pair of electrode films laid on both sides of this piezoelectric film, as disclosed in Patent Literature 1 or 2. Known materials of the electrode films are noble metals such as Au, Pt, and Ir.

Patent Literature 1: Japanese Patent Application Laid-open No. 2010-103194

Patent Literature 2: Japanese Patent Application Laid-open No. 2006-286911

SUMMARY OF THE INVENTION

However, there are demands for further reduction in cost of the piezoelectric devices. The present invention has been accomplished in view of this problem and provides a piezoelectric device capable of further reduction in cost.

A piezoelectric device according to the present invention comprises a first electrode film, a piezoelectric film provided on the first electrode film, and a second electrode film provided on the piezoelectric film. At least one of the pair of electrode films is composed of an alloy and a major component of the alloy is a metal selected from the group consisting of Ti, Al, Mg, and Zn.

(Ti Alloy)

The alloy is preferably an alloy containing Ti as the major component. More preferably, the major component of the alloy is Ti and the alloy contains Al as a minor component. Furthermore, the alloy is preferably one containing 90-96 atomic % (at % hereinafter) Ti and 4-10 at % Al.

Another preferred configuration is such that the major component of the alloy is Ti and the alloy contains Al and V as minor components. In this case, the alloy is preferably one containing 90-96 at % Ti, 2-7 at % Al, and 2-5 at % V.

(Mg Alloy)

The foregoing alloy is preferably an alloy containing Mg as the major component. More preferably, the major component of the alloy is Mg and the alloy contains Al as a minor component. Furthermore, the alloy is preferably one containing 92-98 at % Mg and 2-8 at % Al.

(Al Alloy)

The foregoing alloy is preferably an alloy containing Al as the major component. More preferably, the major component of the alloy is Al and the alloy contains an element selected from Cu, Mg, and Mn, as a minor component. Furthermore, the alloy is preferably one containing 90-99 at % Al and 1-6 at % of an element selected from Cu, Mg, and Mn.

(Zn Alloy)

The foregoing alloy is preferably an alloy containing Zn as the major component. More preferably, the major component of the alloy is Zn and the alloy contains Al as a minor component. The alloy is preferably one containing 80-92 at % Zn and 8-20 at % Al.

The pair of electrode films preferably have a non-oriented or amorphous structure. The piezoelectric film preferably has a preferentially oriented structure.

In the present invention the "preferentially oriented structure" refers to a structure such that in the result of X-ray diffraction measurement, an intensity of a peak ascribed to a certain crystal lattice plane is not less than 50% of a total of intensities of all peaks. The "non-oriented structure" refers to a structure such that in X-ray diffraction measurement, an intensity of a peak ascribed to any crystal plane is less than 50% of a total of intensities of all peaks. The "amorphous structure" refers to a structure such that in X-ray diffraction measurement, no peak is observed to be ascribed to a crystal lattice plane.

The pair of electrode films in the present invention can contain a metal element other than the above-described elements and can also contain an element other than metals.

In the present invention, an oxidation-reduction potential of every metal element forming the pair of electrode films is preferably higher than that of every metal element forming the piezoelectric film. This makes the piezoelectric film chemically and electrically stable, without being reduced by the electrode films, thereby to further improve the lifetime and reliability of the piezoelectric device.

One principal surface of the piezoelectric film can be in contact with the first electrode film and the other principal surface of the piezoelectric film can be in contact with the second electrode film (cf. (b) in FIG. 1).

In the present invention, the piezoelectric device preferably further comprises an intermediate film composed of a metal selected from Al, Ti, Zr, Ta, Cr, Co, and Ni, between at least one electrode film and the piezoelectric film, for the purpose of improvement in adhesion between the two films. An oxidation-reduction potential of the metal forming this intermediate film is preferably lower than that of any one of metal elements forming the piezoelectric film.

The intermediate film can be in contact with the electrode film and the piezoelectric film (cf. (c) in FIG. 1).

It is believed herein that a requisite minimum oxidation-reduction reaction occurs between the intermediate film and the piezoelectric film, so as to improve adhesion between the films. However, if the oxidation-reduction reaction is promoted too much, a composition balance of the piezoelectric film will be lost, so as to cause degradation of the piezoelectric property in some cases; therefore, there is, naturally, an upper limit to the film thickness of the intermediate film.

When the piezoelectric device comprises the intermediate film, an electroconductive oxide film composed of an electroconductive oxide may be provided between either of the electrode films and the piezoelectric film, preferably between the intermediate film and the piezoelectric film, for the purpose of preventing characteristic degradation of the device. This configuration makes the piezoelectric film less likely to be reduced by the electrode film, so as to further improve the device in degradation of characteristics.

The intermediate film or the electroconductive oxide film can be in contact with the piezoelectric film (cf. (d) in FIG. 1).

The piezoelectric device can further comprise a metal film having a preferentially oriented structure, between the second electrode film and the piezoelectric film, and the metal film can be in contact with the second electrode film and the piezoelectric film (cf. (a) in FIG. 1).

The present invention provides the piezoelectric devices capable of further reduction in cost.

BRIEF DESCRIPTION OF THE DRAWINGS

Sections (a) to (d) in FIG. 1 are schematic sectional views of piezoelectric devices according to embodiments of the present invention.

Figure 1:
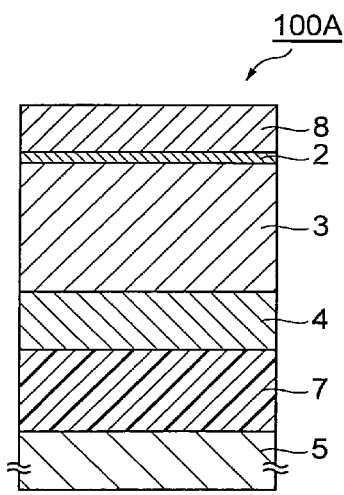
Figure 1:
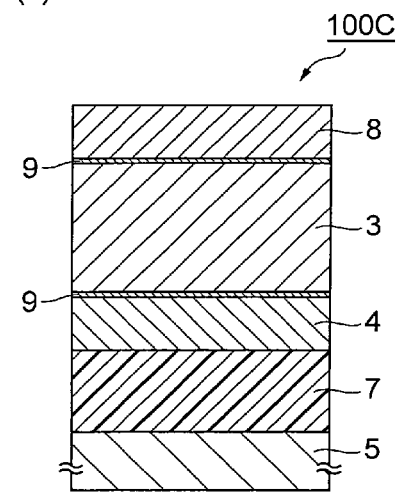
Figure 1:
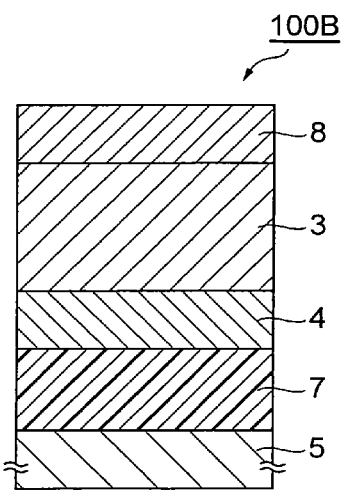
Figure 1:
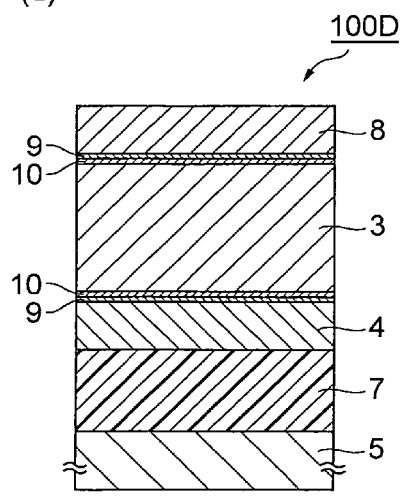
Figure 2:
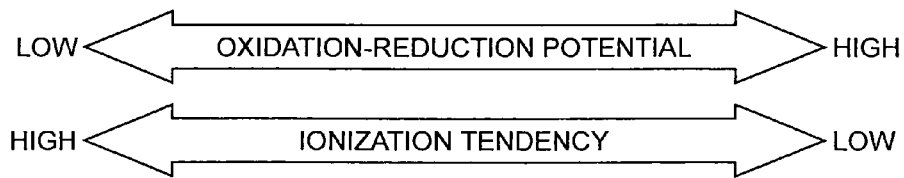
FIG. 2 is a table showing oxidation-reduction potentials of metals.
Figure 3:
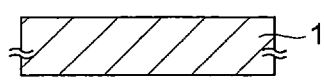
Figure 3:
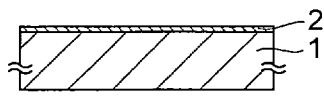
Figure 3:
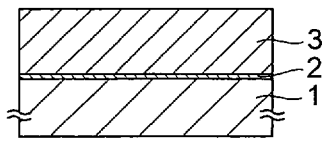
Figure 3:
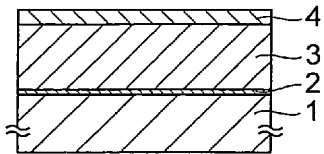
Figure 3:
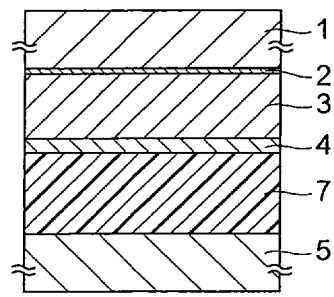
Figure 3:
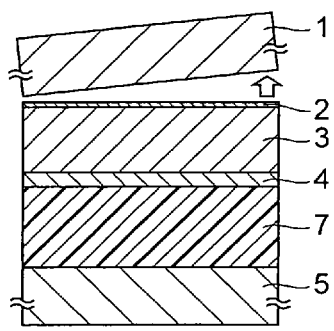
Figure 3:
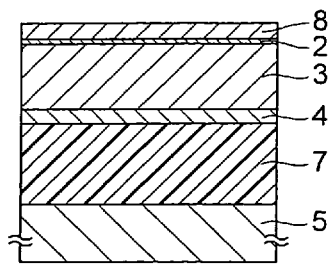

Sections (a) to (g) in FIG. 3 are schematic sectional views showing methods for manufacturing the piezoelectric devices in FIG. 1.

Figure 4:
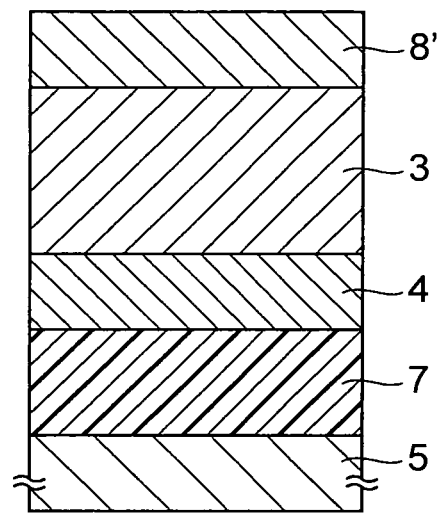

FIG. 4 is a schematic sectional view of a piezoelectric device in Comparative Example 1.

DESCRIPTION OF THE PREFERRED EMBODIMENTS

Embodiments of the present invention will be described below in detail with reference to the drawings.

(Piezoelectric Device 100A)

A piezoelectric device 100A according to an embodiment of the present invention will be described with reference to (a) in FIG. 1. The piezoelectric device 100A is disposed on a resin layer 7 which is laid on a support substrate 5, and has a first electrode film 4, a piezoelectric film 3, a metal film 2, and a second electrode film 8 in the order named.

(Piezoelectric Film 3)

The piezoelectric film 3 is a film with the piezoelectric property. The piezoelectric film preferably has a preferentially oriented structure. The "preferentially oriented structure" refers to a structure such that in the result of X-ray diffraction measurement, an intensity of a peak ascribed to a certain crystal lattice plane is not less than 50% of a total of intensities of all peaks. The piezoelectric film 3 is preferably one such that in the result of X-ray diffraction measurement, an intensity of a peak ascribed to a certain crystal lattice plane is not less than 80% of a total of intensities of all peaks. The piezoelectric film 3 is preferably (001) or (110) preferentially oriented. This configuration allows the piezoelectric film 3 to be provided with the piezoelectric property of an excellent characteristic.

Preferred examples of piezoelectric film 3 include films of KNN or equivalently (K,Na)NbO$_3$ (Young's modulus: 104 GPa), LN or equivalently LiNbO$_3$ (Young's modulus: 171 GPa), AlN (Young's modulus: 300 GPa), and so on.

There are no particular restrictions on the thickness of the piezoelectric film 3, but the thickness is normally in the range of about 1000 nm to 4000 nm.

(Electrode Films 4, 8)

The first electrode film 4 is laid on a bottom surface of the piezoelectric film 3, while the second electrode film 8 is laid on a top surface of the piezoelectric film 3.

Specifically, at least one of the pair of electrode films 4, 8 is composed of an alloy and a major component of the alloy is preferably a metal selected from the group consisting of Ti, Al, Mg, and Zn. The major component herein is a component having the largest concentration in atomic ratio. Preferably, both of the pair of electrode films 4, 8 are composed of the aforementioned alloy. A minor component is a component except for the major component.

(Ti Alloys)

Examples of alloys containing Ti as the major component include alloys containing Ti as the major component and Al as a minor component. For example, it is preferable to adopt one of alloys containing 90-96 at % Ti and 4-10 at % Al. It is also preferable to employ an alloy containing Ti as the major component and Al and V as minor components. This alloy is preferably one containing 90-96 at % Ti, 2-7 at % Al, and 2-5 at % V. Furthermore, it is also preferable to use a Ti alloy containing Al, V, and Cr as minor components. A content of the elements such as Cr other than Al, V, and Ti is preferably not more than 2 at %. The alloys as described above can have the Young's modulus in the range of 80 to 100 GPa and the electrical conductivity in the range of 0.6 to 1×10$^6$ S/m.

(Mg Alloys)

Examples of alloys containing Mg as the major component include alloys containing Mg as the major component and Al as a minor component. For example, it is preferable to adopt one of alloys containing 92-98 at % Mg and 2-8 at % Al. It is also preferable to use an alloy containing Mn and/or Zn, in addition to Mg and Al. A content of each of Mn and Zn is preferably 0.5-5 at %. The alloys as described above can have the Young's modulus in the range of 40 to 45 GPa and the electrical conductivity in the range of 10 to 15×10$^6$ S/m. The electrical conductivity of platinum is approximately 10×10$^6$ S/m.

(Al Alloys)

Examples of alloys containing Al as the major component include alloys containing Al as the major component and any element selected from Cu, Mg, and Mn, as a minor component. For example, it is preferable to adopt one of alloys containing 90-99 at % Al and 1-6 at % of an element selected from Cu, Mg, and Mn. The alloys as described above can have the Young's modulus in the range of 70 to 80 GPa and the electrical conductivity in the range of 15 to 20×10$^6$ S/m. A content of a third additive element except for Al, Cu, Mg, and Mn is preferably not more than 2 at %. Particularly, it is preferable to use an alloy containing Al as the major component and Mg as a minor component.

(Zn Alloys)

Examples of alloys containing Zn as the major component include alloys containing Zn as the major component and Al as a minor component. For example, it is preferable to adopt one of alloys containing 80-92 at % Zn and 8-20 at % Al. The alloys as described above can have the Young's modulus in the range of 75 to 90 GPa and the electrical conductivity in the range of 15 to 17×10$^6$ S/m. A content of a third additive element except for Zn and Al is preferably not more than 2 at %.

Since these alloys generally have better oxidation resistance than the elemental metals of the major component, the piezoelectric device is improved in reliability. In terms of driving characteristics of the piezoelectric device, the Young's modulus of the electrode films 4, 8 is preferably lower than that of the piezoelectric film 3. For example, the Young's modulus of the electrode films 4, 8 is preferably not more than 100 GPa.

In terms of improvement in reliability to prevent characteristic degradation due to the battery effect, an oxidation-reduction potential of every metal element in the alloy forming the electrode films 4, 8 is preferably higher than that of every metal element forming the piezoelectric film 3. When this condition is met, an oxidation-reduction reaction is remarkably suppressed between the piezoelectric film 3 and the electrode films 4, 8 to reduce time degradation of the piezoelectric film 3 due to the battery effect, so as to enhance the reliability of the device. The material of each of the electrode films 4, 8 preferably has a melting point sufficiently higher than heat loads applied in subsequent processes.

As described above, the material of the electrode films 4, 8 to be employed can be any one of materials with a relatively low melting point other than Pt, Ir, Pd, and Rh having high melting points.

There are no particular restrictions on the thicknesses of the electrode films 4, 8, but the thicknesses can be determined in the range of 100 nm to 200 nm.

Each of the electrode films 4, 8 preferably has a non-oriented or amorphous structure. Both of the two electrode films may have the amorphous structure; or, both of the electrode films may have the non-oriented structure; or, one of the electrode films may have the non-oriented structure while the other electrode film has the amorphous structure. The "non-oriented structure" refers to a structure such that in X-ray diffraction measurement, an intensity of a peak ascribed to any crystal plane is less than 50% of a total of intensities of all peaks. The electrode films 4, 8 are preferably those such that in the result of X-ray diffraction measurement, an intensity of a peak ascribed to a certain crystal lattice plane is not more than 10% of a total of intensities of all peaks. The "amorphous structure" refers to a structure such that no peak is observed to be ascribed to a crystal lattice plane in X-ray diffraction measurement.

(Metal Film 2)

The metal film 2 is provided between the electrode film 8 and the piezoelectric film 3 and the metal film 2 is in contact with the piezoelectric film 3 and the second electrode film 8. The metal film 2 has a preferentially oriented structure; that is, the metal film 2 has a structure such that in X-ray diffraction measurement, an intensity of a peak ascribed to a certain crystal lattice plane is not less than 50% of a total of intensities of all peaks. The metal film 2 is more preferably one such that in X-ray diffraction measurement, an intensity of a peak ascribed to a certain crystal lattice plane is not less than 80% of a total of intensities of all peaks. The thickness of the metal film 2 is selected so as to enhance the crystallinity of the piezoelectric film 3 epitaxially grown in contact with the metal film 2.

For example, the thickness of the metal film 2 is preferably in the range of 20 nm to 70 nm. It is noted that in this small thickness range, it is difficult for the metal film 2 alone to function as an electrode film of the piezoelectric device 100A. A metal forming the metal film 2 can be selected from metals (including alloys) having the a-axis lattice constant smaller than that of the piezoelectric film 3 and having thermal resistance to temperature during deposition of the piezoelectric film, and the metal is preferably Pt or Rh.

There is the metal film 2 remaining between the piezoelectric film 3 and the electrode film 8, whereas there is no other film between the piezoelectric film 3 and the electrode film 4.

(Piezoelectric device 100B)

A piezoelectric device 100B according to an embodiment of the present invention will be described with reference to (b) in FIG. 1. This piezoelectric device 100B is different from the piezoelectric device 100A in that the piezoelectric device 100B does not have the metal film 2 and therefore the electrode film 8 is in direct contact with the piezoelectric film 3. Furthermore, there is no other film between the piezoelectric film 3 and the electrode film 4, as in the first embodiment.

(Piezoelectric Device 100C)

A piezoelectric device 100C according to an embodiment of the present invention will be described with reference to (c) in FIG. 1. This piezoelectric device 100C is different from the piezoelectric device 100B in that intermediate films 9 composed of a metal having the oxidation-reduction potential lower than that of any one of metal elements forming the piezoelectric film 3 are provided, one between the electrode film 8 and the piezoelectric film 3 and the other between the electrode film 4 and the piezoelectric film 3.

For example, when the piezoelectric film 3 is potassium sodium niobate: $(K,Na)NbO_3$, a standard is Nb (oxidation-reduction potential: $-1.099$ V) having the highest oxidation-reduction potential among the three elements except oxygen. Then, metal films composed of Ti (oxidation-reduction potential: $-1.63$ V) having the oxidation-reduction potential lower than Nb can be used as the intermediate films 9. The same also applies to the case of the piezoelectric film 3 being lithium niobate.

The intermediate films 9 are preferably composed of any element selected from Al, Ti, Zr, Ta, Cr, Co, and Ni.

The thicknesses of the intermediate films 9 are preferably in the range of 2 nm to 5 nm, from the viewpoint of minimizing the oxidation-reduction reaction with the piezoelectric film 3 while enhancing the adhesion strength between the piezoelectric film 3 and the electrode films 4, 8. The film thicknesses of more than 5 nm can degrade the characteristics of the piezoelectric film and the thicknesses of less than 2 nm can lead to insufficient function as an adhesion layer. The intermediate films 9 may have a preferentially oriented structure or may have a non-oriented or amorphous structure, but they preferably have the non-oriented or amorphous structure. The preferentially oriented, non-oriented, and amorphous structures all are as described above.

The intermediate films 9 are preferably those such that in X-ray diffraction measurement, an intensity of a peak ascribed to any crystal plane is not more than 10% of a total of intensities of all peaks.

For example, when the piezoelectric film 3 is composed of potassium sodium niobate and when the intermediate films 9 are composed of Ti, the surfaces of the piezoelectric film 3 can be reduced because the oxidation-reduction potential of Ti: $-1.63$ V is lower than that of Nb: $-1.099$ V. Therefore, the thicknesses of the intermediate films 9 are preferably not too large while being enough to enhance adhesion.

Even if the metal element of the alloy forming the electrode films 4, 8 has the oxidation-reduction potential higher than every metal element forming the piezoelectric film 3, the presence of the intermediate films 9 makes it easier to improve the adhesion strength between the two electrode films 4, 8 and the piezoelectric film 3.

(Piezoelectric Device 100D)

A piezoelectric device 100D according to an embodiment of the present invention will be described with reference to (d) in FIG. 1. This piezoelectric device 100D is different from the piezoelectric device 100C in that electroconductive oxide films 10 are provided respectively between the piezoelectric film 3 and the intermediate films 9. The piezoelectric device 100D may have a single electroconductive oxide film 10 and it can be located anywhere between the electrode film 4, 8 and the piezoelectric film 3.

The electroconductive oxide films 10 provide an effect to suppress the oxidation-reduction reaction between the intermediate films 9 and the piezoelectric film 3. The electroconductive oxide is preferably an oxide containing one metal element having the oxidation-reduction potential higher than every metal element forming the piezoelectric film 3 and containing a metal element having the oxidation-reduction potential lower than the metal element forming the intermediate films 9. Examples of such electroconductive oxides include SRO ($SrRuO_3$), ITO ($In_2O_3$—$SnO_2$), and so on.

The thicknesses of the electroconductive oxide films 10 are, for example, in the range of about 5 nm to 20 nm. The electroconductive oxide films 10 can be formed, for example, by sputtering.

The electroconductive oxide films 10 may have a preferentially oriented structure or may have a non-oriented or amorphous structure, but they preferably have the non-oriented or amorphous structure. The preferentially oriented, non-oriented, and amorphous structures all are as described above. The electroconductive oxide films 10 are preferably films such that in X-ray diffraction measurement, an intensity of a peak ascribed to any crystal plane is not more than 10% of a total of intensities of all peaks.

Namely, the piezoelectric devices of the embodiments have the effects as described below. Since the specific alloy is used, the electrode films have high oxidation resistance. The electrode films can be made at lower cost. Since it is easy to decrease the Young's modulus of the electrodes, the piezoelectric device can be improved in performance. It is also feasible to increase deposition rates of the electrodes.

In the piezoelectric devices 100B-100D, the two principal surfaces of the piezoelectric film 3 both are preferably in contact with a film having a non-oriented or amorphous structure. In this case, an underlying film, which was used in epitaxial growth of the piezoelectric film 3, is removed.

(Methods for Manufacturing Piezoelectric Devices)

Subsequently, methods for manufacturing the aforementioned piezoelectric devices 100A-100D will be described with reference to FIG. 3.

First, a substrate 1 is prepared, as shown in (a) in FIG. 3. Examples of substrate 1 are substrates of single-crystal Si, sapphire, magnesium oxide, and so on, and a single-crystal Si substrate is suitably applicable, particularly, to the case where a piezoelectric film of PZT or the like is formed thereon.

Then, as shown in (b) in FIG. 3, a metal film 2 to serve as an underlying film for piezoelectric film 3 is formed on the substrate 1. The metal film 2 is obtained, for example, by evaporation, sputtering, or the like in such a manner that a metal material is epitaxially grown on the substrate 1, under the condition that the substrate 1 is kept at high temperature. For example, when the metal material is sputtered in a state in which the Si substrate 1 is heated at about 400-600° C., the metal film 2 can be obtained as one preferentially oriented corresponding to the surface orientation of the Si substrate 1. Although the metal film 2 is not essential, the piezoelectric film 3 tends to have higher crystallinity with the use of the metal film 2.

Next, as shown in (c) in FIG. 3, a piezoelectric film 3 is formed on the metal film 2. The preferentially oriented piezoelectric film 3 can be obtained by sputtering or the like in such a manner that a piezoelectric material is epitaxially grown on the underlying layer, under the condition that the underlying layer, i.e., the substrate 1 and the metal film 2, is kept at high temperature. The Si substrate 1 and the metal film 2 are preferably heated at about 400-600° C.

Next, as shown in (d) in FIG. 3, an electrode film 4 is formed on the piezoelectric film 3.

The electrode film 4 is preferably obtained by depositing a metal material on the piezoelectric film 3, without epitaxial growth. Specifically, a film of a non-oriented or amorphous structure is obtained by depositing the metal material at low temperature by sputtering, evaporation, or the like. Since the film is formed without epitaxial growth, it can be formed at a high deposition rate in a short time. The substrate 1 and the piezoelectric film 3 are preferably kept at a temperature in the range of room temperature to 200° C.

Next, as shown in (e) in FIG. 3, after the deposition of the electrode film 4, the electrode film 4 is bonded to a support substrate 5 by resin layer 7.

An example of the support substrate 5 is a polycrystalline silicon substrate. Examples of the resin layer 7 include epoxy resin and silicone resin, and the epoxy resin is preferably applicable, particularly, in terms of rigidity. The bonding may be implemented, for example, by a method of applying an adhesive in the thickness of about 2000-5000 nm onto the support substrate 5 and the electrode film 4 by spin coating, and then stacking and bonding them in vacuum.

Next, as shown in (1) in FIG. 3, the substrate 1 is removed from the metal film 2. The removal of the substrate 1 can be implemented by a method such as CMP (chemical mechanical polishing) or RIE (reactive ion etching). After the substrate 1 is removed, the metal film 2, which was the underlying film for the piezoelectric film 3, is exposed as the outermost surface.

Thereafter, as shown in (g) in FIG. 3, an electrode film 8 is formed on the metal film 2. The electrode film 8 may be formed by the same method as the electrode film 4. This completes the piezoelectric device 100A having the electrode films 4, 8 and the piezoelectric film 3.

If necessary, the piezoelectric device 100A can be patterned on the support substrate 5. If necessary, a protecting film to protect the piezoelectric device 100A may be formed. If necessary, the piezoelectric device 100A may be singulated; or, it may be singulated after the piezoelectric device 100A is separated from the support substrate 5; or, the piezoelectric device 100A may be singulated by cutting it together with the support substrate 5.

The piezoelectric device 100A with the electrode films 4, 8 above and below the piezoelectric film 3 can be obtained in the manner as described above.

The piezoelectric device 100B can be manufactured by also removing the metal film 2 as well as the substrate 1, in (0 in FIG. 3.

The piezoelectric device 100C can be manufactured by forming the intermediate film 9, before the formation of each of the electrode films 4, 8 in the aforementioned process of the piezoelectric device 100B. The intermediate films may be formed by sputtering or the like.

The intermediate films do not have to be formed by epitaxial growth, either.

The piezoelectric device 100D can be manufactured by forming the electroconductive oxide film 10 and the intermediate film 9 in this order, before the formation of each of the electrode films 4, 8 in the aforementioned process of the piezoelectric device 100B. The electroconductive oxide films 10 can be formed by sputtering or the like. The electroconductive oxide films do not have to be formed by epitaxial growth, either.

In this piezoelectric device 100A, since substrate heating and low-rate sputtering are not essential conditions in the deposition of the electrode films 4, 8, the deposition time is drastically reduced from the conventional time of 10 to 20 minutes per layer. The manufacturing cost of piezoelectric device is significantly improved by synergistic effect of the process throughput improvement and the reduction in material cost of the electrode films 4, 8.

EXAMPLES

Example 1

Piezoelectric device 100A

In a state in which an Si substrate 1 was heated at 400° C., a Pt film was epitaxially grown in the thickness of 50 nm on the surface orientation of the Si substrate 1 by sputtering to obtain a (100) preferentially oriented metal film 2 on the Si substrate 1. A growth rate of the Pt film was 0.2 nm/sec. Thereafter, in a state in which the Si substrate 1 was heated at 550° C., a potassium sodium niobate (KNN) film was epitaxially grown as piezoelectric film 3 in the thickness of 2000 nm on the metal film 2 by sputtering to obtain a (110) preferentially oriented piezoelectric film 3. Thereafter, at room temperature, a Zn-Al alloy (atomic composition $Zn_{88}Al_{12}$; Young's modulus 90 GPa which was smaller than that of the piezoelectric film 3; resistivity $6.38 \times 10^{-8}$ 106 m) film was deposited in the thickness of 200 nm on the piezoelectric film 3 by sputtering to obtain an amorphous electrode film 4.

Thereafter, the electrode film 4 was bonded to an Si support substrate 5 by an epoxy resin layer 7. Thereafter, the Si substrate 1 was removed from the metal film 2 by an etching process based on RIE. Then a Zn—Al alloy film (whose composition and properties were the same as those of the electrode film 4) was formed in the thickness of 200 nm on the metal film 2 by sputtering at room temperature to obtain an amorphous electrode film 8. A deposition rate of the electrode film 8 was 2 nm/sec.

Example 2

Piezoelectric Device 100B

A piezoelectric device 100B was obtained in the same manner as in Example 1, except that the metal film 2 was also etched in addition to the Si substrate 1 in the removal of the Si substrate 1.

Example 3

Piezoelectric Device 100C

A piezoelectric device 100C was obtained in the same manner as in Example 2, except that intermediate films 9 of a non-oriented structure composed of Ti were provided in the thickness of 5 nm between the piezoelectric film 3 and the two electrode films 4, 8 by sputtering. This configuration improved the adhesion between the electrode films 4, 8 and the piezoelectric film 3.

Example 4

Piezoelectric Device 100D

A piezoelectric device 100D was obtained in the same manner as in Example 3, except that electroconductive oxide films 10 of a non-oriented structure composed of $SrRuO_3$ were provided in the thickness of 20 nm respectively between the intermediate films 9 and the piezoelectric film 3 by sputtering. The present example suppressed the oxidation-reduction reaction between the intermediate films 9 and the piezoelectric film 3 while enhancing the adhesion between the electrode films 4, 8 and the piezoelectric film 3, thereby achieving high reliability of the device based on the chemical stability of the piezoelectric film 3.

Example 5

Piezoelectric Device 100A'

A piezoelectric device 100A' was obtained in the same manner as in Example 1, except that an $Al_{95}$—$Cu_5$ alloy was used for the electrode films 4, 8.

Example 6

Piezoelectric Device 100A"

A piezoelectric device 100A" was obtained in the same manner as in Example 1, except that a $Ti_{90}Al_6V_4$ alloy was used for the electrode films 4, 8.

Example 7

Piezoelectric Device 100A'''

A piezoelectric device 100A''' was obtained in the same manner as in Example 1, except that an $Mg_{96}Al_4$ alloy was used for the electrode films 4, 8.

Comparative Example 1

Piezoelectric Device

In a state in which an Si substrate 1 was heated at 400° C., a Pt film was epitaxially grown in the thickness of 200 nm on the surface orientation of the Si substrate 1 by sputtering to obtain a (100) preferentially oriented electrode film 8' on the Si substrate 1. A deposition rate at this time was 0.2 nm/sec. Thereafter, in a state in which the Si substrate 1 was heated at 550° C., a potassium sodium niobate (KNN) film was epitaxially grown as piezoelectric film 3 in the thickness of 2000 nm on the electrode film 8' by sputtering to obtain a (110) preferentially oriented piezoelectric film 3. Subsequently, at room temperature, a Pt film was deposited in the thickness of 200 nm on the piezoelectric film 3 by sputtering to obtain a non-oriented electrode film 4. Thereafter, the electrode film 4 was bonded to an Si support substrate 5 by an epoxy resin layer 7. Thereafter, the Si substrate 1 was removed from the electrode film 8' by an etching process based on RIE. The configuration of the resultant device is shown in FIG. 4.

The piezoelectric devices of Example 1 and Comparative Example 1 were patterned so as to form a piezoelectric movable portion in the movable portion size of 1 mm×2 mm, and the support substrate 5 was removed to obtain rectangular piezoelectric devices. These piezoelectric devices were fixed to a thin plate of stainless steel with wiring of flexible cables, a voltage was then applied to the pair of electrode films in each of the piezoelectric devices, and displacements of the thin plate were compared. The AC voltage of 5 kHz and 0-10 V was applied to each of the piezoelectric devices to implement displacement thereof. The displacements were determined as follows: a laser beam was applied to an Au film disposed in advance on the stainless steel thin plate, a reflected beam thereof was received by a laser Doppler measuring device, and a displacement per unit applied voltage was calculated. The displacement of the piezoelectric device of Example 1 was 15.3 nm/V and the displacement of the piezoelectric device of Comparative Example 1 was 11.2 nm/V. The displacements of the piezoelectric devices of Examples 2-5 were also sufficiently larger than the displacement of the comparative example, as in the case of Example 1.

Next, a comparison was made between the crystallinities of the piezoelectric films in the piezoelectric devices of Example 1 and Comparative Example 1. The measurement was conducted by X-ray diffractometry, using ATX-E of Rigaku Corporation as a measuring device and the Out-of-Plane method as a measuring method. Percentages of the peak intensity of (110) orientation to the overall peak intensity were measured under this condition; the percentages were found to be 92% in the film configuration in the first example and 61% in the film configuration in the comparative example.

In the piezoelectric devices of Example 1 and Comparative Example 1, the deposition times of the electrode film 8 and the electrode film 8' were one minute and forty seconds and about seventeen minutes, respectively.

What is claimed is:

1. A piezoelectric device comprising:
a first electrode film;
a piezoelectric film provided on the first electrode film;
a second electrode film provided on the piezoelectric film; and
an electroconductive oxide film between the piezoelectric film and at least one of the electrode films;
wherein at least one of the first and second electrode films is composed of an alloy and a major component of the alloy is one metal selected from the group consisting of Ti, Al, Mg, and Zn.

2. The piezoelectric device according to claim 1, wherein the alloy is an alloy containing Ti as the major component.

3. The piezoelectric device according to claim 1, wherein the major component of the alloy is Ti and the alloy contains Al as a minor component.

4. The piezoelectric device according to claim 3, wherein the alloy contains 90-96 at % Ti and 4-10 at % Al.

5. The piezoelectric device according to claim 1, wherein the major component of the alloy is Ti and the alloy contains Al and V as minor components.

6. The piezoelectric device according to claim 4, wherein the alloy contains 90-96 at % Ti, 2-7 at % Al, and 2-5 at % V.

7. The piezoelectric device according to claim 1, wherein the alloy is an alloy containing Mg as the major component.

8. The piezoelectric device according to claim 1, wherein the major component of the alloy is Mg and the alloy contains Al as a minor component.

9. The piezoelectric device according to claim 8, wherein the alloy contains 92-98 at % Mg and 2-8 at % Al.

10. The piezoelectric device according to claim 1, wherein the alloy is an alloy containing Al as the major component.

11. The piezoelectric device according to claim 1, wherein the major component of the alloy is Al and the alloy contains an element selected from Cu, Mg, and Mn, as a minor component.

12. The piezoelectric device according to claim 11, wherein the alloy contains 90-99 at % Al and 1-6 at % of an element selected from Cu, Mg, and Mn.

13. The piezoelectric device according to claim 1, wherein the alloy is an alloy containing Zn as the major component.

14. The piezoelectric device according to claim 1, wherein the major component of the alloy is Zn and the alloy contains Al as a minor component.

15. The piezoelectric device according to claim 14, wherein the alloy contains 80-92 at % Zn and 8-20 at % Al.

16. The piezoelectric device according to claim 1, wherein the first and second electrode films have a non-oriented or amorphous structure.

17. The piezoelectric device according to claim 1, wherein the piezoelectric film has a preferentially oriented structure.

18. The piezoelectric device according to claim 1, further comprising an intermediate film composed of an element selected from Al, Ti, Zr, Ta, Cr, Co, and Ni, between the piezoelectric film and at least one of the electrode film.

* * * * *